United States Patent
Kuhns et al.

(10) Patent No.: US 6,816,125 B2
(45) Date of Patent: Nov. 9, 2004

(54) FORMING ELECTROMAGNETIC COMMUNICATION CIRCUIT COMPONENTS USING DENSIFIED METAL POWDER

(75) Inventors: David W. Kuhns, Minneapolis, MN (US); David C. Koskenmaki, Frazier Park, CA (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/377,960

(22) Filed: Mar. 1, 2003

(65) Prior Publication Data

US 2004/0174257 A1 Sep. 9, 2004

(51) Int. Cl.[7] ............................ G01V 15/00; H05K 7/10
(52) U.S. Cl. ...................... 343/880; 340/508; 340/509; 343/728; 343/729; 343/895
(58) Field of Search ............................... 340/508, 509; 343/728, 729, 880, 895; 428/209

(56) References Cited

U.S. PATENT DOCUMENTS

| | | |
|---|---|---|
| 2,407,680 A | 9/1946 | Palmquist et al. |
| 2,721,152 A | 10/1955 | Hopf et al. |
| 2,757,443 A | 8/1956 | Steigerwalt et al. |
| 2,963,748 A | 12/1960 | Young |
| 3,190,178 A | 6/1965 | McKenzie |
| 3,628,243 A | 12/1971 | Phol et al. |
| 3,800,020 A | 3/1974 | Parfet |
| 4,247,498 A | 1/1981 | Castro |
| 4,403,107 A | 9/1983 | Hoffman |
| 4,588,258 A | 5/1986 | Hoopman |
| 4,614,837 A | 9/1986 | Kane et al. |
| 4,649,397 A | 3/1987 | Heaton et al. |
| 4,799,983 A | 1/1989 | Desai |
| 4,867,881 A | 9/1989 | Kinzer |
| 5,032,450 A | 7/1991 | Rechlicz et al. |

(List continued on next page.)

FOREIGN PATENT DOCUMENTS

| | | |
|---|---|---|
| EP | 0 297 678 A1 | 1/1989 |
| FR | 2 823 310 | 10/2002 |
| JP | 11-353443 | 12/1999 |
| JP | 2000-48147 | 2/2000 |
| JP | 2000-105806 | 4/2000 |
| JP | 2000-105807 | 4/2000 |
| JP | 2000-151459 | 5/2000 |
| JP | 2000-194810 | 7/2000 |
| JP | 2000-194820 | 7/2000 |
| JP | 2000-338879 | 12/2000 |
| WO | WO 88/09541 A1 | 12/1988 |
| WO | WO 97/21118 A1 | 6/1997 |
| WO | 01/45935 A1 | 6/2001 |
| WO | WO 01/71848 A1 | 9/2001 |
| WO | WO 02/11094 A1 | 2/2002 |
| WO | WO 02/45042 A1 | 6/2002 |
| WO | WO 02/077939 A1 | 10/2002 |

OTHER PUBLICATIONS

"Glossary of Terms Used in the Pressure Sensitive Tape Industry", provided by the Pressure Sensitive Tape Council, Aug., 1985.

Rodal, "Exploring Volume Change, Angular Distortion in a Calendering Nip," *Pulp & Paper*, 1993, pp. 1–8.

*Primary Examiner*—Cathy Lam
(74) *Attorney, Agent, or Firm*—Melissa E. Buss

(57) ABSTRACT

Manufacturing techniques are described for forming electrical components. For example, a layer of a metal powder composition is deposited onto at least a portion of a substrate. Pressure is applied to the metal powder composition by hydraulic press that has one or more projections in order to capture a pattern on the substrate. The metal powder composition compressed by the projections of the hydraulic press adhere to the substrate to form the captured pattern. The metal powder composition in regions not compressed by the projections of hydraulic press do not adhere to the substrate and may be removed. The metal powder composition may be compressed to form electrical components, such as antennae, capacitor plates, conduction pads and the like, for use in an electronic surveillance system (EAS), a radio frequency identification (RFID) system, or the like.

40 Claims, 6 Drawing Sheets

U.S. PATENT DOCUMENTS

| | | | |
|---|---|---|---|
| 5,059,485 A | | 10/1991 | Parr et al. |
| 5,061,438 A | | 10/1991 | Lillie et al. |
| 5,087,494 A | * | 2/1992 | Calhoun et al. ............ 428/40.1 |
| 5,108,822 A | * | 4/1992 | Imaichi et al. ............... 428/209 |
| 5,196,262 A | | 3/1993 | Schwarz et al. |
| 5,346,750 A | * | 9/1994 | Hatakeyama et al. ....... 428/209 |
| 5,450,235 A | | 9/1995 | Smith et al. |
| 5,468,540 A | | 11/1995 | Lu |
| 5,510,171 A | | 4/1996 | Faykish |
| 5,517,195 A | | 5/1996 | Narlow et al. |
| 5,528,222 A | | 6/1996 | Moskowitz et al. |
| 5,591,527 A | | 1/1997 | Lu |
| 5,761,801 A | | 6/1998 | Gebhardt et al. |
| 5,781,110 A | * | 7/1998 | Habeger et al. .......... 340/572.5 |
| 5,817,834 A | | 10/1998 | Kameswaran |
| 6,004,646 A | | 12/1999 | Ohno et al. |
| 6,050,622 A | | 4/2000 | Gustafson |
| 6,107,920 A | | 8/2000 | Eberhardt et al. |
| 6,121,880 A | | 9/2000 | Scott et al. |
| 6,164,551 A | * | 12/2000 | Altwasser ................... 235/492 |
| 6,353,420 B1 | * | 3/2002 | Chung ........................ 343/895 |
| 6,384,727 B1 | | 5/2002 | Diprizio et al. |
| 6,421,013 B1 | | 7/2002 | Chung |
| 6,459,588 B1 | * | 10/2002 | Morizumi et al. .......... 361/737 |
| 6,522,308 B1 | * | 2/2003 | Mathieu ..................... 343/895 |
| 6,591,496 B2 | * | 7/2003 | Koskenmaki et al. ......... 29/846 |
| 6,662,430 B2 | * | 12/2003 | Brady et al. .................. 29/600 |
| 6,665,193 B1 | * | 12/2003 | Chung et al. ............... 361/760 |
| 2002/0142121 A1 | | 10/2002 | Hingsen-Gehrmann et al. |
| 2003/0016133 A1 | | 1/2003 | Egbert |
| 2003/0091789 A1 | | 5/2003 | Koskenmaki et al. |

* cited by examiner

`US 6,816,125 B2`

FORMING ELECTROMAGNETIC COMMUNICATION CIRCUIT COMPONENTS USING DENSIFIED METAL POWDER

TECHNICAL FIELD

This invention relates to electrical articles made from metal powder compositions, as well as to methods for their manufacture.

BACKGROUND

Patterned metal articles, such as printed circuit boards, have many uses in the electronics industry. Printed circuits may be made by applying pressure with a heated die to metallic particles on an adhesive-coated substrate. Metal particles may also be mixed with a curable organic binder, and applied to a substrate using an adhesive layer, heat and pressure. Printed circuits may also be produced by embedding conductive granules mixed with an inorganic matrix material into a heat-softenable substrate. Silk screening methods may also be used to apply mixtures of organic materials and conductive particles to substrates, and compositions including metallo-organic compounds and metallic particles may also be silk screened on a substrate and heated to form a circuit pattern.

The adhesives and organic binders in these compositions are poor conductors of electricity, and, when mixed with metallic particles, reduce the overall conductivity of the resulting circuit patter. The use of inorganic and metallo-organic compounds is limited to specific combinations of materials and particular substrates, and requires high processing temperatures.

SUMMARY

The invention provides an article comprising a conductive pattern on a substrate that forms all or part of one or more electrical components of an electromagnetic communication circuit, wherein the conductive pattern comprises a densified metal powder composition.

The invention provides an apparatus comprising at least one loop that forms an antenna to absorb and radiate energy and optionally at least one capacitor plate electrically coupled to the loop of the antenna to tune a resonant frequency of the antenna, wherein at least one of the antenna and the capacitor plate are defined by a conductive pattern of densified metal powder composition on a substrate.

The components of this invention may be combined with other components to form many functional articles, for example, radio frequency identification tags (also known as RFID inlays), RFID labels, resonant labels (also known as resonance labels), hardware components such as antennae, labels providing direct-contact connection to integrated circuits, tickets or cards which may optionally contain integrated circuits, batteries, fuses, displays, sensors and the like.

The invention also provides components of systems. For example, in a radio frequency identification system, the invention may provide an antenna coupled to a radio frequency identification reader proximate the storage area to produce an electromagnetic field and a radio frequency identification reader coupled to the antenna to power the antenna to communicate with the radio frequency identification tag. At least a portion of the radio frequency identification tag is defined by a conductive pattern of densified metal powder composition on a substrate. In another example, the invention may provide a resonant label, applied to or contained within the packaging of retail goods and used as part of a system to provide protection from theft in retail stores.

The invention makes it possible to produce a suitably conductive pattern on paper and other compressible substrates. These substrates are generally inexpensive materials and provide benefits to the final article such as, for example, flexibility, conformability, specific surface properties, and ease of recycling. The inventive method may be performed at low cost since it requires a minimum number of process steps and materials, does not require extreme, specialized or slow process steps, and minimizes process waste and pollution.

Examples of useful electrical components which may be made by this invention are electrical circuits, loop antennae (also known as coil antennae), dipole antennae, connectors, connector pads, capacitors, capacitor plates, bridges (also known as jumpers), resonant coils (also known as resonance coils), vias, resistors and electrical connections between these and other components.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
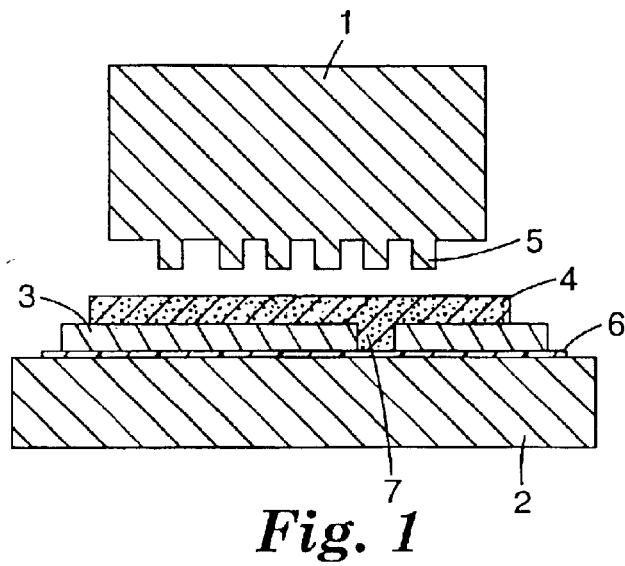
FIG. 1 is a cross-sectional view of a hydraulic press used in an embodiment of the invention.

Referring to FIG. 1, a layer of a metal powder composition 4 is deposited onto all or a selected part of a substrate 3.

The metal powder composition 4 may include finely divided metal particles. The metal particles suitable for use in the metal powder composition include copper, tin, nickel, iron, steel, platinum, aluminum, silver, gold, lead, zinc and the like, and copper is particularly preferred. The metal powder composition may also include conductive non-metal powders, such as, for example, graphite. The metal powder composition 4 may contain only one metal or it may contain two or more metals, in such combinations as a mixture of particles of two or more metals, particles comprising alloys, blends or mixtures, particles of one metal coated with a second metal, and the like. Alternatively, a metal powder composition or combination of metal powder compositions can be deposited as an underlayer, and a different metal powder composition or combination of metal powder compositions can then be deposited as an overlayer.

The shape of the particles in the metal powder composition 4 can vary widely. The metal particles can be of the same shape or of different shapes and can be regularly or irregularly shaped. Exemplary particle shapes include, for example, spheres, oblongs, needles, dendrites, polyhedra (e.g., tetragons, cubes, pyramids and the like), prisms, flakes, rods, plates, fibers, chips, whiskers, and mixtures thereof. Similarly, the sizes of the metal particles in the metal powder composition 4 can vary widely, and may include monodisperse particles, a multi-modal distribution of particle sizes, or a broad distribution of particle sizes. Preferably, the particles in the metal powder composition 4 have a mean particle size of approximately 0.1 to about 2000 um; preferably between about 0.2 um and about 1000 um; most preferably between about 1 um and about 500 um.

Figure 2:
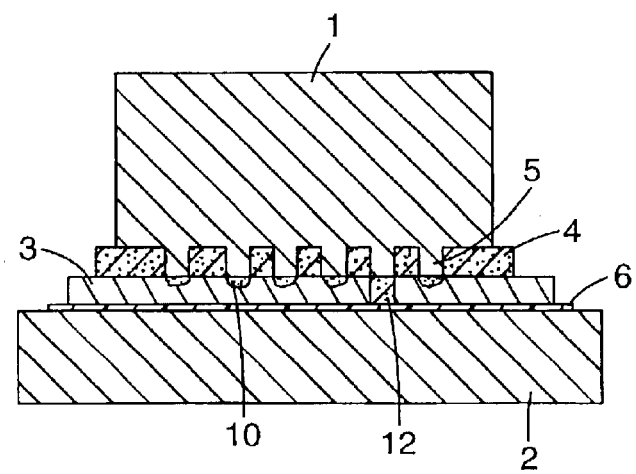
FIG. 2 is a cross-sectional view of the hydraulic press of FIG. 1 that is used to capture a conductive pattern in accordance with the invention.

One or more of the metal powders in the metal powder composition can be treated to remove all or a portion of any surface oxides. Methods are known to those skilled in the art and vary for different metals, and include reduction (e.g., with hydrogen at elevated temperatures), washing with acidic or basic solutions, and the like. The treatment can be carried out prior to application of the metal powder composition to the substrate, while the metal powder composition is deposited on the substrate (as shown in FIG. 1) or after capture of the metal powder (as shown in FIG. 2, described below). Such treatment may occur prior to application of the metal powder composition to the substrate.

The metal powder composition 4 can be deposited onto the substrate 3 in a variety of forms, such as a substantially dry powder, or with a gas, liquid or solid material added to modify its flow properties. Such additives may be substantially removed from the metal powder at some point during the practice of the inventive method, so that the final article contains metal patterns comprising no more than 5 percent by weight of additives, preferably no more than 3% by weight, and most preferably no more than 1% by weight. Suitable additive agents to modify flow properties may include water, solvents, anti-caking agents, lubricants, air, nitrogen and combinations thereof. Liquids that function as carrier materials are preferred. If a carrier liquid is used, the metal powder composition may appear in the form of a dampened powder or a slurry. The metal powder composition, whether deposited with flow-modifying additives or not, should have flow characteristics that allow it to level and fill features on the surface of the substrate such as surface voids, spaces between fibers or optional vias 7 (See FIG. 1).

The metal powder composition may include additional components and additives, for example, wetting agents, antistatic agents, antiflocculants, colorants, cleaning agents, anti-oxidants and wet or dry fluxes, provided that the final article contains metal patterns comprising no more than 5 percent by weight of additives, preferably no more than 3% by weight, and most preferably no more than 1% by weight. For example, if the metal powder composition is a liquid slurry, the slurry can also contain chemical agents to prevent oxidation of the metal powder.

Substrate 3 is paper or a compressible material. In the practice of the inventive method, initially, a substrate meeting this requirement is selected. As used herein, compressible means that a substrate reduces in its dimension parallel to an applied pressure and that the total volume of the substrate is also reduced by a similar amount. When used herein as a quantitative measure, X % compressible means that the dimension of a substrate measured parallel to an applied pressure of 30 MPa is [(100−X)/100] times its dimension in this direction at 0.07 MPa and the total volume of the substrate at 30 MPa is [(100−X)/100] times its volume at 0.07 MPa. If the dimension change in the direction of the applied pressure and the volume change yield different values of X, then the smaller X of the two values is used to define the quantitative compressibility of the material.

Compressibility is a physical property of a substrate that may be measured as part of the process of substrate selection. The compressibility is measured over an entire sample of a substrate (as described, for example, in Example 32 below), and is not a function of localized behavior as may be observed during the application of pressure in a particular pattern to a portion of a substrate. Compressibility is a function of the structural properties of the substrate material, particularly the presence of significant amounts of voids, pores, inter-fiber spaces or other open spaces. Preferably, following release of an applied pressure, substrates still show dimension and volume changes of at least 10%, more preferably they show dimension and volume changes that are at least 50% of the percent compressibility observed at 30 Mpa, and most preferably they maintain dimension and volume changes that are at least 75% of the percent compressibility achieved at 30 MPa.

Fully or highly dense materials, such as extruded or cast polymeric films, may exhibit isotropic or anisotropic volume changes as a result of applied pressure, due to changes between the crystalline and amorphous state. These materials are typically not sufficiently compressible for use in the process of the invention. Similarly, fully or highly dense green-state composite materials may show volume changes upon heating and curing, but would not be expected to be sufficiently compressible for use in the process of the invention.

The substrate 3 may be flexible, which means than it may be bent by hand around a rod of approximately 5 cm in diameter, preferably 2 cm in diameter. The substrate can be of any suitable thickness that maintains this flexibility, and preferably has a thickness of less than 5000 microns; more preferably less than 2000 microns; most preferably less than 1000 microns.

The substrate 3 is preferably less conductive that the conductive metal pattern which is formed through the practice of this invention. Substrates 3 suitable for the practice of this invention include paper and compressible fibrous and non-fibrous materials, including those manufactured from synthetic or naturally occurring polymers, or combinations thereof. Suitable forms of these substrates include nonwovens including dry-lay and wet-lay nonwovens, nonwovens made by melt-blown fiber, spun bond or spun lace processes, woven and knit fabrics, membranes, foams (preferably open-cell foams) and expanded webs, and webs comprised of cast fibers.

Paper is one preferred substrate 3 and a variety of papers are suitable, including but not limited to kraft paper, stationery paper, copier paper, filter paper, newsprint, cardstock, folder stock, printing paper, specialty papers, paper products such as pulp board and the like. Suitable papers may be made by various processes and may contain fillers, sizing agents, pigments, dyes, and others additives as known to those skilled in the art. Suitable papers may be calendered or non-calendered, processed to provide various finishes and coated or uncoated.

Suitable nonwoven substrates can include membranes or porous materials, such as, for example, ultrafiltration membranes, microporous materials, cast polymeric membranes, and thermally induced phase transition materials (TIPS), which are described in U.S. Pat. Nos. 4,247,498 and 4,867,881. One suitable substrate is a particle-filled, microporous material, commercially available from PPG Industries, Pittsburgh, Pa., under the trade designation Teslin. Teslin is described by its manufacturer as a dimensionally stable, polyolefin based, microporous, printing sheet with 60% of its weight including a non-abrasive filler and with 65% of its volume including air.

Suitable substrate materials may be fibrous and fiber-like materials including silk and cellulosic or lignocellulosic materials, such as for example, flax, hemp, cotton, jute, or synthetic cellulosic or lignocellulosic materials such as rayon.

Suitable substrates can be made from a variety of polymers, including thermoplastic, thermoset, elastomeric, and crosslinked polymers. Examples of suitable polymers include polyamides, polyurethanes, polyolefins (e.g., polyethylene and polypropylene), polystyrene, polycarbonate, polyethers, polyvinylchloride, silicones, fluoropolymers, polysulfones, nylons, cellulose acetate, ethylenically unsaturated polymers, and suitable combinations thereof.

Substrates can optionally include inorganic filler particles, such as ceramics, metal oxides (e.g., tantalum oxide) and high dielectric constant ceramics (e.g., barium titanate, barium strontium titanate, titanium dioxide, and lead zirconium titanate, and mixtures thereof). Other suitable ceramic fillers include silica, precipitated silica, zirconia, alumina, glass fibers, and the like. Suitable non-ceramic fillers include polymer fibers and carbon fibers. Other additives include, for example, dyes, pigments, plasticizers, sizing agents, anti-oxidants, flame retardants, and the like.

Substrate materials can optionally receive additional chemical or physical treatment, such as calendering, embossing, surface treatment (e.g. plasma treatment, Corona treatment or silanization) and the like, prior to the deposition of the metal powder composition.

The substrate may comprise a single layer or optionally a plurality of layers arranged in a laminate structure. The layers in the laminate structure may be made of the same material or of different materials. The substrate may include a removable carrier layer. The substrate may also include an adhesive layer, so long as the multilayer substrate is compressible and the adhesive layer is not positioned or processed to capture the metal powder composition or adhere conductive metal patterns to the substrate.

Any suitable method may be used to deposit the metal powder composition onto the substrate, such as, for example, notch bar coating, knife coating, dipping, sifting, screening, spraying, blowing, or application of a fluidized bed. The metal powder composition may be applied in a single application or in multiple applications, with the same or different metal powder compositions, or different compositions or amounts of composition may be applied to different regions of the substrate, depending on the desired shape, conductivity and thickness of the conductive pattern in the finished product.

FIG. 1 shows an optional via 7, which is a hole that passes completely through the substrate 3. The optional via 7 is filled with metal powder composition 4 as shown in FIG. 1. An optional liner 6 may be used to contain the metal powder composition 4 within the optional via 7 during processing.

The substrate 3 and the optional liner 6 reside on a platen 2, which may be maintained at a desired temperature. Although FIG. 1 depicts a flat configuration for platen 2 and substrate 3, other geometries are also within the scope of the invention, and in particular a curved geometry may be employed.

Hydraulic press 1 has a die 5 with projections or male portions. Although it is not visible in the cross-sectional representation in FIG. 1, the projections of die 5 are shaped to produce a pattern in the plane of the substrate. Any pattern may be machined onto the die 5 (and thereby imparted to metal powder composition 4 on substrate 3), such as, for example, straight or curved lines, grids, coils, circles, rectangles, triangles, hexagons and other geometric shapes which may be either solidly filled or outlines of these shapes, irregular shapes, and combinations thereof.

In one embodiment of the invention, referring to FIG. 2, pressure is then applied by hydraulic press 1 in the pattern of the projections of die 5 to metal powder composition 4 to capture a pattern on the substrate. Metal powder composition in region 10 is compressed into and adheres to substrate 3 to form the captured pattern, while the metal powder composition in regions 11 remains uncaptured (shown in FIG. 3 but not in FIG. 2). The projections on the die 5 also capture the metal powder composition within a region 12 in the optional via 7.

The processing conditions used to capture the pattern will vary widely depending on the metal powders selected for use in the metal powder composition, as well as the properties of the substrate material. Temperatures, pressures and application times should be selected to substantially minimize, and preferably eliminate, damage to the substrate 3, such as melting, warping, buckling, blistering, or decomposing. Preferably, the platen 2 is maintained at a temperature between 50 and −25° C., and the die 5, or at least the raised portions of die 5, are maintained at a temperature between 20 and 250° C., preferably between 20 and 200° C. Useful processing pressure is in the range of 20 MPa to 400 MPa, and pressure is maintained for up to 300 seconds. Preferably, platen 2 and die 5 are maintained at about 20 to 25° C., and a pressure between about 35 MPa and 200 MPa is maintained for no more than about 60 seconds.

The capture process may be performed in a continuous process using, for example, a rotary die, or in a batchwise or step-and-repeat process using a flat die in hydraulic press 1. Substrate material may be handled in the form of narrow or wide webs, sheets, sheets supported on webs, and the like, and the use of this invention in the practice of large-scale manufacturing will be apparent to those skilled in the art.

To capture the metal powder composition 4, pressure may be applied by any known method, for example, using hydraulic press 1 alone or in combination with an acoustic apparatus, using a patterned ultrasonic horn (not in shown FIG. 1) patterned similarly to die 5. The application of acoustic energy may provide advantages in process conditions (such as lower temperature or pressure) or in the performance of the final article.

Repetitive capture using the same or different metal powder compositions on the same or different areas of substrate 3 may be performed, for example, to give a thicker captured region consisting of multiple layers of the same metal powder composition, or to provide discrete layers of two or more captured metals, or to provide different metals in different areas of substrate 3, or to meet specific product requirements for the final article.

Figure 3:
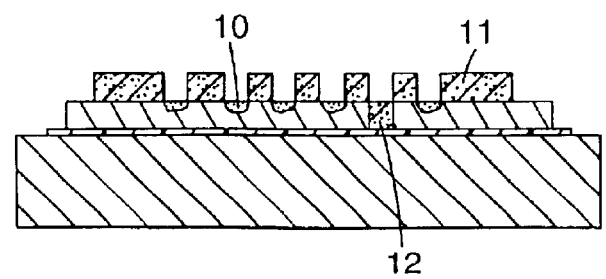
FIG. 3 is a cross-sectional view of an article following the capture of a conductive pattern.

Referring to FIG. 3, once the die 5 is removed, a captured pattern of metal powder composition adheres to the substrate 3 in regions 10, 12, while metal powder composition remains unadhered on the substrate 3 in regions 11. Although the adhered metal powder composition in region 10 is shown in FIG. 3 as having a top surface, which is coplanar with the top surface of the substrate 3, in the practice of this invention the top surface of metal 10 may be above, coplanar with or below the top surface of the substrate 3. The residual, unadhered metal powder composition in regions 11 may optionally be substantially removed from the substrate by a variety of conventional methods, for example, compressed air, vacuum, vibration, brushing, blowing, gravity, aqueous wash, and suitable combinations thereof. The term capture as used herein means that the metal powder composition in regions 10, 12 which has been subjected to pressure by the projections of die 5 adheres sufficiently to the substrate 3 so that after removal of die 5 as shown in FIG. 3 the metal powder composition in regions 11 may subsequently be substantially removed without removing the adhered metal powder composition in regions 10, 12. Metal powder composition that is removed may optionally be recycled. Preferably, unadhered powder is removed before densification as shown in FIG. 4.

Alternatively, metal powder may be applied to the substrate using a stencil or mask. A stencil has perforations, holes or sections cut out or removed in a pattern and of such dimensions that metal powder is passed through the stencil and is deposited in a corresponding pattern. The stencil may contain sections of closely spaced perforations through which metal is deposited with a small amount of scatter or spread, to form a deposit of substantially continuous and uniform metal powder, or the stencil may contain a continuous open section through which metal powder is deposited. If the stencil contains perforations, they must be large enough to allow the metal powder to move through them. When a stencil is used, it may be preferable to use metal powder which is wetted with a small amount of liquid, such as water, or a slightly wetted substrate, to enhance handling on the substrate. With the use of a stencil, it is not necessary to remove excess metal powder, since it is only deposited in the desired locations. Preferably, after depositing metal powder through a stencil, the substrate and powder will be manipulated with sufficient care, so that the pattern is maintained in the densification step.

Figure 4:
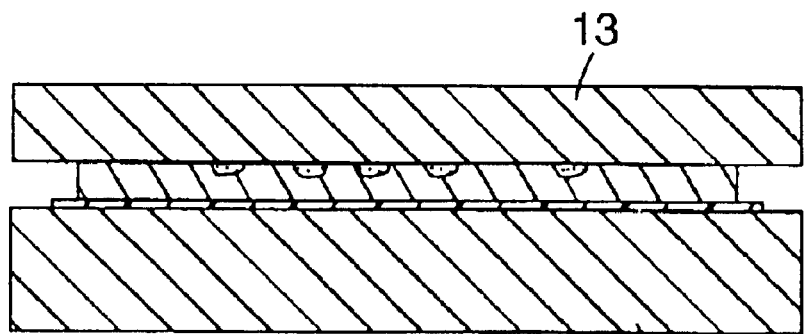
FIG. 4 is a cross-sectional view of a portion of a hydraulic press used for densification of the captured conductive pattern.

In one embodiment of the invention, referring to FIG. 4, a densifying energy in the form of a second pressure is then applied with platens 13, 22 to regions 10, 12 of the pattern to densify the pattern. Preferably, this process increases the adhesion of the pattern to the substrate 3 and makes the pattern more conductive as well as possibly smoothing the surface of between regions 10, 12 and substrate 3. The resulting conductive pattern on the surface of the substrate 3 has a Figure of Merit (FOM, described in greater detail below) of greater than about 5%, preferably greater than about 10%, and more preferably greater than about 20%. The second pressure may be applied as hydraulic pressure, and optionally heat, acoustic or microwave energy may be simultaneously or subsequently applied. Ultrasonic energy, heat or microwave energy may also be employed prior to the application of pressure referred to in FIG. 4, or may be employed alone to accomplish densification without the application of a second pressure. Variations in process order and various combinations of processes and energy sources used to accomplish capture and densification are within the scope of the invention.

Preferably, the second pressure is applied to opposed sides of the patterned substrate 3 with platens 13, 22 to minimize distortion at the interface and between the edges of the conductive pattern 10 and the substrate surface. Although FIG. 4 depicts a flat configuration for each platen 13, 22 and substrate 3, other geometries are also within the scope of the invention, and in particular at least one curved geometry may be employed. Preferably, pressure is applied substantially equally to the metallized and unmetallized portions of the substrate.

Densification may be performed in a continuous process by such means, for example, as calendar rolls, a hot zone or a sonication zone, or in a batchwise or step-and-repeat process using, for example, a hydraulic press, a thermal or microwave oven, or an ultrasonic horn. Substrate material may be handled in the form of narrow or wide webs, sheets, sheets supported on webs, and the like, and the use of this invention in the practice of large-scale manufacturing will be apparent to those skilled in the art.

The pressure applied during densification is about 20 MPa to about 400 MPa, preferably about 60 MPa to 200 MPa. Densification at these pressures is conducted at temperatures from about 20° C. to 250° C., preferably about 50° C. to 200° C. most preferably about 100° C. to about 150° C. With application of other sources of densifying energy such as ultrasonic energy, different temperatures ranges may be preferred, as is demonstrated in the Examples.

Figure 5:
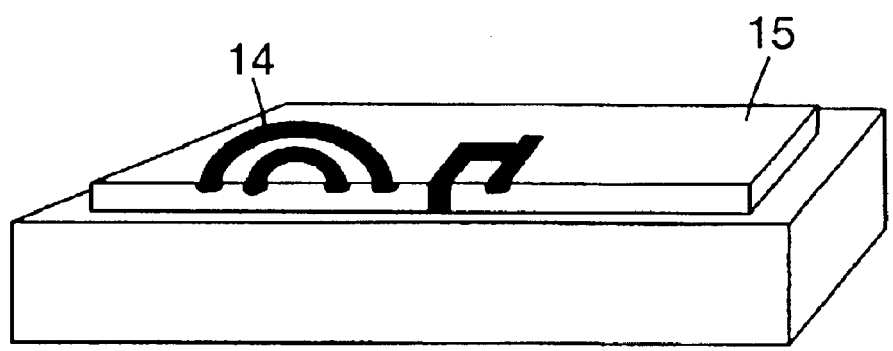
FIG. 5 is a perspective view of an article including circuit elements.

Referring to FIG. 5, the platen 13 is then removed, and the resulting article includes electrical components comprising a conductive metal pattern 14 adhered on a surface 15 of the substrate 3. As used herein, an electrical component is any metal pattern or shape or combination of metal patterns and shapes that may comprise all or part of a component that is found in a functional electrical device. Examples include traces that provide electrical circuits, loop antennae, dipole antennae, connectors, connection pads, capacitors, capacitor plates, bridges, resonant coils, vias, resistors, inductive coils, and the like.

A Figure of Merit (FOM) can be used to compare a pressed powder measured resistance to the minimum possible theoretical resistivity for copper, according to the following equation:

$$\% \ FOM = (R_{theoretical}/R_{measured}) \times 100\%$$

where $R_{theoretical}$ is the resistivity of copper and $R_{measured}$ is the measured resistance of the pressed powder pattern. Resistance is the raw data that is measured for a particular sample, and this is normalized for the cross-section and length of a particular sample to arrive at a calculated resistivity, as described more fully in Example 1. The method of the present invention can be used to make articles comprising circuit elements with a conductive pattern having a Figure of Merit greater than about 5%, preferably greater than about 10%, and more preferably greater than about 20%.

The conductive pattern 14 adheres well to the substrate, and withstands moderate bending and abrasion. For example, adhesion of the metal pattern to the substrate can be determined by measuring the resistance of the metal pattern during and after the bending of the article around rods of various diameters, as described in Example 25. The change in resistivity upon bending depends on the components of the metal powder composition and the substrate material. Preferably, articles including the circuit elements will withstand bending around a rod of diameter of 50 mm, more preferably 20 mm, without significant resistance increases. Without wishing to be bound by theory, adhesion may be due to mechanical attachment or entanglement resulting from compressing the metal powder composition and substrate simultaneously.

Following densification, the article including circuit elements may optionally undergo further additional processing such as conversion, lamination, patterning, etching, coating, assembly and the like. Additional layers may be applied and these additional layers may also comprise electrically conductive patterns.

The manufacturing process of the invention may be conducted at mild temperatures as indicated by the preferred ranges above. Lower process temperatures result in reduced processing costs and also enable the use of substrate materials that arc not stable at high temperatures. It is advantageous to be able to select substrate materials for a variety of properties including flexibility, surface energy, environmental stability, reuse or recyclability, chemical composition, low cost and so on, as may be required to meet various product specifications, without being limited by process temperature requirements.

In one embodiment, the techniques may be used to provide an article which may include all or part of one or more electrical components for use in an electromagnetic communication circuit. The circuit may be used in a communication system. An Example article is an RFID tag. Example electrical components include an antenna, connector pads for bridges or jumpers, connector pads for integrated circuits, circuitry, capacitor plates, capacitors, bridges, vias and the like. In one embodiment, the invention provides at least a major portion of the antenna, such that the paper or compressible substrate of the invention also forms a major layer in the construction of the RFID tag.

Optionally, the RFID tag is a combination tag that includes an RFID element and a magnetic security element.

In another embodiment, the techniques may be used to provide an article which may include all or part of one or more electrical components of a resonant label, such as an antenna, connector pads for bridges or jumpers, circuitry, capacitor plates, capacitors, bridges, vias, fuses and the like. The techniques may be used to provide at least a major portion of the antenna, such that the paper or compressible substrate of the invention also forms a major layer in the construction of the resonant label. Resonant labels may be used, for example, to provide protection from theft in retail stores, and in some applications it may be preferable for the label to contain a fuse, capacitor or other component whose properties and performance can be changed by the application of a current, voltage or electromagnetic field.

In yet another embodiment, the techniques may be used to provide an article with at least one connection pad electrically connected to at least one integrated circuit (including but not limited to integrated circuits made on a silicon wafer substrate, often referred to as die or chips). For example, a conductive metal pattern on a substrate which is paper or a compressible material may form connection pads and also be connected (directly or via conductive adhesive, solder, wirebonding or the like) to an integrated circuit, to provide an article in which electrical connection of an external device or article to the integrated circuit is accomplished by contacting and making an electrical connection to the connection pad of the conductive metal pattern. The integrated circuit may be bare or packaged. In this example, the connection pads of the conductive metal may be formed larger than the connection sites on the integrated circuit, to allow for easier access and connection by the external device or article, particularly if the dimensions of the integrated circuit and the attach pads on the integrated circuit arc small (less than approximately 2 mm)

In yet another embodiment, the techniques may provide provides electrical components that are resistors and fuses. The process may employ different materials or conditions to produce these components. For example, the use of combinations of different metal powders, (such as copper, tin, or an alloy such as steel) may yield traces of lower conductivity (higher resistivity) suitable as resistors and fuses. Variations in process conditions, for example densification pressure or temperature, may also result in traces suitable as resistors and fuses. Additionally traces of the same metal powder can be pressed at varying widths to achieve varying resistance for use as resistors or fuses. Furthermore, it may be useful to combine components of higher and lower conductivity, for example by electrically connecting traces of higher and lower conductivity (wider and narrower widths, respectively) to create a resistor or fuse in parallel or series with a conductive component. Such combinations of components could also be made with different combinations of metal powder, arranged to give sections of higher and lower conductivity. Those skilled in the art will recognize that under different conditions of use, components of this invention may behave differently. For example, under one applied voltage or applied current, a component may function as a conductive trace, while under a second applied voltage or applied current, a component may function as a fuse.

In a further embodiment, the techniques provide electrical connection to a battery or to make a battery electrode. The techniques of the invention can further be used to make articles wherein the conductive metal pattern provides at least one connection to or provides components of sensors, such as chemical sensors, medical sensors and physical sensors. The invention can also be used to make connections to components of displays. Combinations of these are also within the scope of the invention. For example, a battery life sensor may comprise conductive metal patterns that connect a battery to an indicating display.

In another embodiment, the invention provides components of hardgoods or hardware. For example, the invention may provide an antenna which is incorporated into an RFID reader or RFID shelf.

In yet another embodiment, the invention also provides electrical components of systems. Examples of such systems are wireless tracking or surveillance systems. For example, in a radio frequency identification (RFID) system, the invention may provide an antenna coupled to a radio frequency identification reader and at least a portion of a radio frequency identification tag applied to individual articles, for example, books or files. In another example, the techniques may be used to provide one or more electrical components use in a resonant label, applied to or contained within the packaging of retail goods and used as part of a system to provide protection from theft in retail stores (also known as Electronic Article Surveillance or EAS systems).

Figure 10:
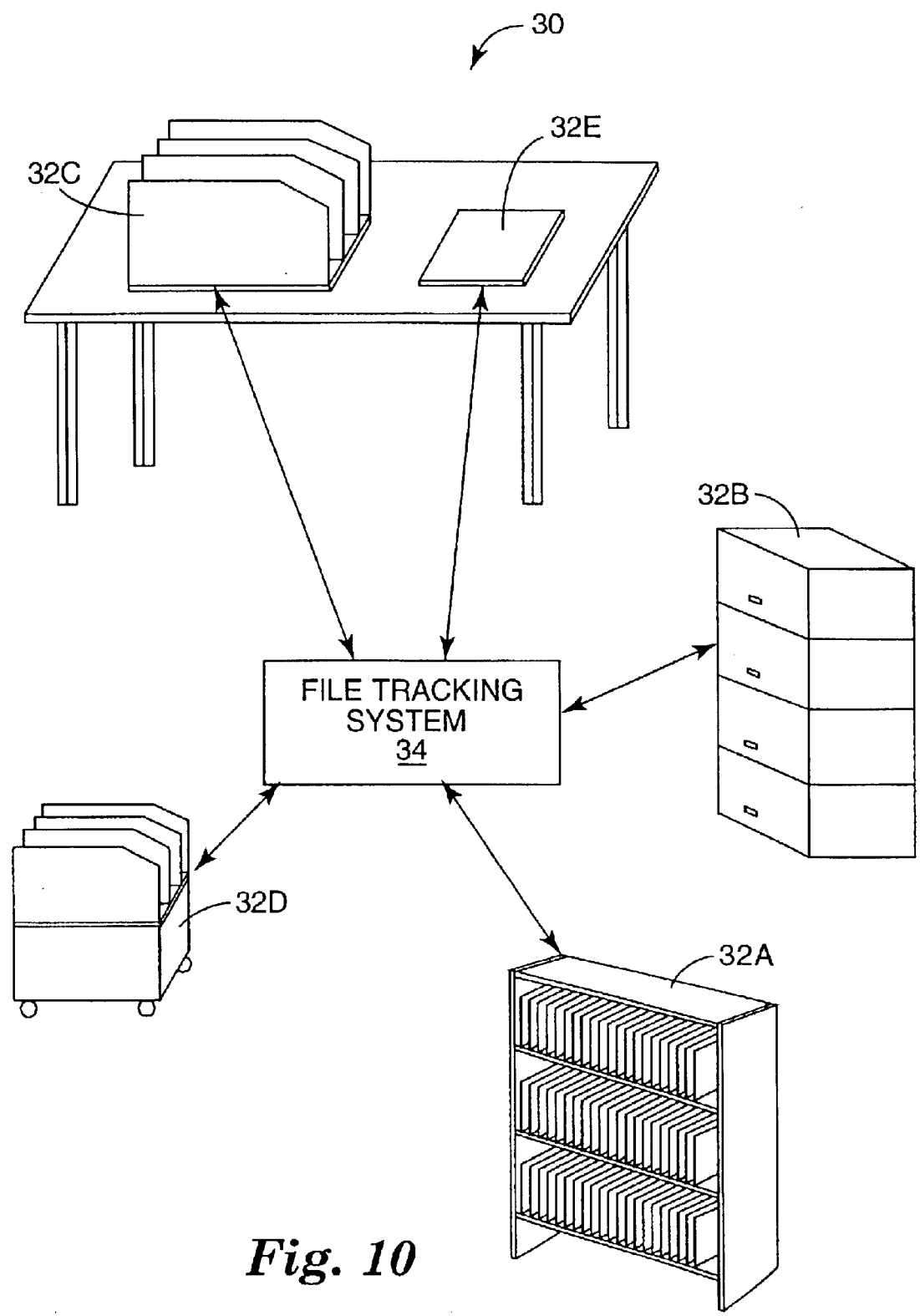
FIG. 10 is a block diagram illustrating an exemplary radio frequency identification (RFID) system for document and file management.

FIG. 10 is a block diagram illustrating an exemplary radio frequency identification (RFID) system 30 for document and file management. As described, the techniques for manufacturing articles by compressing a metal particle composition may be used to produce one or more electrical components for use in one or more electromagnetic communication circuits of RFID system 30. Law offices, government agencies, and facilities for storing business, criminal, and medical records rely heavily on files of paper documents.

These files may be positioned in a number of "smart storage areas" 32, e.g., on an open shelf 32A, a cabinet 32B, a vertical file separator 32C, a smart cart 32D, a desktop reader 32E, or a similar location, as shown in FIG. 10.

RFID tags may be associated with or applied to items of interest. The tag may be embedded within the item or the packaging of the item so that the tag is at least substantially imperceptible, which can help to prevent detection and tampering. For example, to achieve an embedded tag and inexpensive manufacturing, a file folder may be prepared by applying metal powder to portion of the area of a paper substrate of dimensions of the a file folder, capturing a pattern of a portion of an RFID tag, for example an antenna, in that metal powder, removing the excess metal powder and then applying pressure to the entire substrate to both densify the metal powder to form a conductive pattern and to calender the substrate.

Items may be "source-marked" with an RFID tag, such as applying or embedding an RFID tag to an item during its manufacture, as with a file folder, document, book, or the like. Each of the smart storage areas 32 of system 30 may be equipped with one or more antennas for interrogating the files to aid in determining which files are located at each of the storage areas. For example, one or more antennas are positioned within open shelve 32A to create an electromagnetic field for communicating with the RFID tags associated with the files. Similarly, antennas may be located within cabinet 32B, vertical file separator 32C, smart cart 32D, desktop reader 32E, and the like. The antennas may be positioned in various ways, such as on top or bottom of each shelf, at the back of the shelves, or supported vertically, interspersed among the files. The antennas can be retrofitted to existing shelves or built into a shelf and purchased as a unit. For example, an antenna on a paper substrate can be incorporated into a shelf during the manufacturing of the shelf, by treating the paper substrate with a saturant and then laminating the substrate to other materials used in the construction of the shelf.

The techniques may be used to provide electrical components of an article having two or more planes within the article. Such articles are often referred to as multi-layer articles or multi-layer constructions. The invention provides various methods for their production. For example, a conductive pattern may be formed on one surface or on two or more surfaces of a paper or compressible material. Conductive patterns on two surfaces of a substrate may be the same or different and may be aligned or registered so that there is any desired amount of overlap (overlap as used herein refers to a section of the substrate which contains conductive material on both major surfaces).

An article with conductive metal patterns on two surfaces may be produced by making conductive patterns according to this invention on both sides of a single sheet or roll (web) of paper or compressible material, or on both sides of a single sheet or roll comprising more than one material (such as a coated paper or a paper-film laminate). To apply conductive patterns to both sides of a single sheet or roll of paper or compressible material, it may be preferable to utilize different process conditions on each side, for example, a first pressure for capturing the metal powder on a first side, and a second pressure for capturing the pressure on a second side. In another example, a patterned die is used to capture the metal powder on a first side, and a stencil is used to pattern the metal powder on a second side.

Alternatively, an article requiring conductive metal patterns on two or more surfaces may be produced by combining two or more sheets or rolls of paper or other compressible material that each comprise a conductive metal pattern. In one example, each of two rolls or sheets of paper or other compressible material are processed according to the invention so that they comprise a conductive pattern, and the two rolls or sheets are subsequently laminated together. In another example, a conductive pattern is produced on a first roll or sheet of paper or other compressible material, a second sheet of paper or other compressible material is laminated to the first roll or sheet, and this construction is further processed according to the invention to produce a second conductive pattern on the second sheet or roll. Articles requiring multiple layers of conductive metal patterns, for example multilayer circuits, which may optionally be interconnected, are also within the scope of this invention.

In a further example, a first substrate layer comprising a conductive pattern is made, wherein the conductive pattern comprises at least one connector pad. A second substrate layer is prepared by making holes through the second layer in such a pattern that they may be aligned over the connector pads in the first substrate. The layers are aligned, then metal powder is then applied to the second substrate, filling the holes which are positioned over the connector pads in the first substrate layer. Subsequent capture and densification produces a pattern comprising vias between the first and second layers and optionally, other components on the second layer, for example, electrical circuits and capacitor plates. Alternatively, the metal powder can be coated onto the second layer through a stencil, forming a metal powder pattern comprising vias and, optionally, other components.

Any of the articles comprising a conductive pattern according to this invention, may further comprise other parts, from prior, simultaneous or subsequent processing, including but not limited to conductive inks, conductive adhesives, metal foils, magnetic storage media, magnetic security media, solder, wire, saturants including oils, waxes, organic or inorganic polymerizable compositions and polymers, films, laminating adhesives, mechanical fasteners, integrated circuits, and discrete electrical components such as resistors, capacitors, diodes and the like.

Conductive metal patterns on paper or other compressible materials may provide goods, such as paper goods, with advantages related to authentication, identification, tracking, detection, stealth, shielding, costs, and manufacturing processes.

This invention is illustrated by the following examples, but the particular materials and amounts thereof recited in these examples, as well as other conditions and details should not be construed to unduly limit this invention.

EXAMPLES

Example 1

This example presents a sample Figure of Merit (FOM) calculation. The % FOM can be used to compare the measured resistance of a pressed powder pattern to the minimum possible theoretical resistivity for pure copper according to the following equation:

$$\% \ FOM = (R_{theoretical}/R_{measured}) \times 100$$

where $R_{theoretical}$ is the resistivity of pure copper and $R_{measured}$ is calculated from the measured resistance of the sample pressed powder pattern.

The density of solid copper is 8.96 g/cm$^3$. The resistivity of copper is $1.73 \times 10^{-6}$ ohms-cm. To normalize for the mass and cross section of the sample, the mass in grams per unit length in cm and resistance in ohm per unit length in cm are incorporated into the FOM equation, such that:

$$\% \ FOM = (R_{theoretical}/R_{measured}) \times 100$$

where: $R_{theoretical}$=(density of copper)(conductivity of copper)=0.0000155 g-ohm/cm²

$R_{measured}$=[(mass in grams per cm)($R_{measured}$ per cm)]

For example, a metal pattern was pressed onto a layer of copper powder to give a pattern having a mass (M) of 0.402 grams along the distance of the metal pattern, 123 cm. The resistance (R) for this length (L) was 5.7 ohms as measured by a Fluke 189 multimeter by putting the probes at each end of the metal pattern and reading the value in ohms. M/L= 0.402 g/123 cm=3.26×10$^{-3}$ g/cm and R/L=5.7/123=4.6× 10$^{-2}$ ohm/cm. The % FOM for this sample can be calculated as:

$$\% \ FOM = \{0.0000155/[(3.26 \times 10^{-3})(4.6 \times 10^{-2})]\} \times 100 = 10\%$$

A FOM of 10% means that for this case a conductivity was reached that was 10% of the maximum possible for copper. Throughout this patent, samples are compared to copper as the maximum possible theoretical conductivity, even when the metal used in a particular sample is a combination of copper and another metal, another metal or a combination of two other metals.

Example 2

Copper powder (dendritic, 3 micron, 99.7%) from Sigma-Aldrich (Milwaukee Wis.) was cleaned by stirring it in 10% aqueous hydrochloric acid, followed by one rinse of water and 3 rinses of methanol. The copper powder was allowed to dry in air for about 1 hour. A 20 cm diameter #270 sieve was placed at the top of a 20 cm diameter, 46 cm long tube of cardboard. The cardboard tube was placed over a set of seven 55 mm diameter type 54 Whatman filter paper circles. Tin powder (AEE 1-5 micron 99.9%) and then the copper powder was sprinkled into the sieve and allowed to settle down onto the filter paper to a depth that varied from sample to sample from approximately 0.1 mm to 0.5 mm. This method of application of one or more metal powders to substrate is referred to as the sieving method in subsequent examples.

In a first step, the metal powder was captured into a pattern by pressing a patterned die onto the powder using a Carver platen press (Model 3891, Wabash, Ind.) imparting 27 megapascals (MPa) onto the powder and filter paper. The excess powder was then removed.

In a second step, the captured metal powder and substrate were pressed together and densified between two smooth platens. In this second step, a Wabash press applied 112 MPa concurrently with heat at 200° C. for less than two minutes.

The total mass of the compacted metal was 0.459 grams. The resistance of the length of the pattern, 123 cm was 1.3 ohms. A summary of the preparation of this example and %FOM (calculated according to the method in Example 1) are shown in Table 1.

Examples 3 to 8

Examples 3 to 8 were prepared using the sieving method of Example 2. In one step, the metal powder was captured into a pattern and densified by pressing a patterned die onto the powder at the pressures shown in Table 1. Two different paper substrates and a combination of metal powders and particle types were used, as shown in Table 1. The resistance of each sample was measured and the calculated %FOM shown in Table 1.

Table 1 shows the results of using a combination of substrates and metal powders under different sets of conditions. The abbreviations for the substrates and metals are described in Table 2.

Examples 9 to 19

Examples 9 to 19 were prepared using the sieving, first capture step at a first pressure and second step wherein pressure is applied with two smooth platens as described for Example 2. The second pressure was applied at room temperature, except for Example 19 where it was applied at 100° C. The pressures used for each step are indicated in Table 1 (first pressure+second pressure). Materials and calculated %FOM are also shown in Table 1.

TABLE 1

| Example | Materials | Max Force (Mpa) | FOM % Cu max | Conditions |
|---|---|---|---|---|
| 2 | WFP + CUD + Sn | 27 (Step 1) 112 (Step 2) | 45 | Two step press plus 200° C. |
| 3 | WFP + CUD + Sn | 386 | 14 | One step press |
| 4 | WFP + CUD | 340 | 11 | One step press |
| 5 | WFP + CUS | 335 | 2.4 | One step press |
| 6 | HCP + CUD | 370 | 5.6 | One step press |
| 7 | HCP + CUD + Sn | 370 | 5.2 | One step press |
| 8 | WFP + CUD + Sn | 144 | 13 | One step press |
| 9 | WFP + CUD + Sn | 29 + 112 | 15 | Two step press |
| 10 | SPA + CUD + Sn | 61 + 112 | 3.4 | two step |
| 11 | PSB + CUD + Sn | 61 + 112 | 5.9 | two step |
| 12 | PEC + CUD + Sn | 61 + 112 | 5.0 | two step |
| 13 | NSB + CUD + Sn | 61 + 112 | 3.6 | two step |
| 14 | PEP + CUD + Sn | 61 + 112 | 6.9 | two step |
| 15 | WFP + Al + Sn | 90 + 112 | 0.97 | two step |
| 16 | WFP + Al | 90 + 112 | 1.2 | two step |
| 17 | WFP + CUF + Sn | 90 + 112 | 15 | two step |
| 18 | TPP + CUD + Sn | 27 + 112 | 3.3 | two step |
| 19 | TPP + CUD + Sn | 27 + 112 | 5.2 | Two step press plus 100° C. Heat |

TABLE 2

Abbreviations for Table 1

| Substrate material | Abbr. | Source Company |
|---|---|---|
| Whatman 54 Filter paper | WFP | Whatman Inc, Clifton, NJ |
| Polypropylene SMS Fiberweb | PPF | BBA Non-wovens Simpsonville, SC |
| Polyester Pulp PGI Style ww-229 | PEP | Polymer Group Inc, Benson, NC |
| Teslin ™, porous polyethylene | TPP | PPG Industries Pittsburgh, PA |
| Silk 100% | SPA | Shamash & Sons, New York, NY |

TABLE 2-continued

Abbreviations for Table 1

| Substrate material | Abbr. | Source Company |
|---|---|---|
| Polyester 100% cloth | PEC | Sankei Co, Ltd Japan |
| Hammermill copy plus 20/50 lb | HCP | International Paper, Memphis, TN |
| Polypropylene Spun bound | PSB | Polymer Group Inc, Benson, NC |
| Nylon spun bound | NSB | Cerex, Cantonment, Fl |
| Copper powder dendritic | CUD | Sigma-Aldrich Cat#357456 Milwaukee, WI |
| Copper powder flake | CUF | Sigma-Aldrich Cat#292583, Milwaukee, WI |
| Aluminum powder spherical | Al | Alfa Aesar cat#10576, Ward Hill, MA |
| Tin powder | Sn | Atlantic Equipment Engineers Sn-102, Bergenfield, NJ |

Example 20

Figure 6:
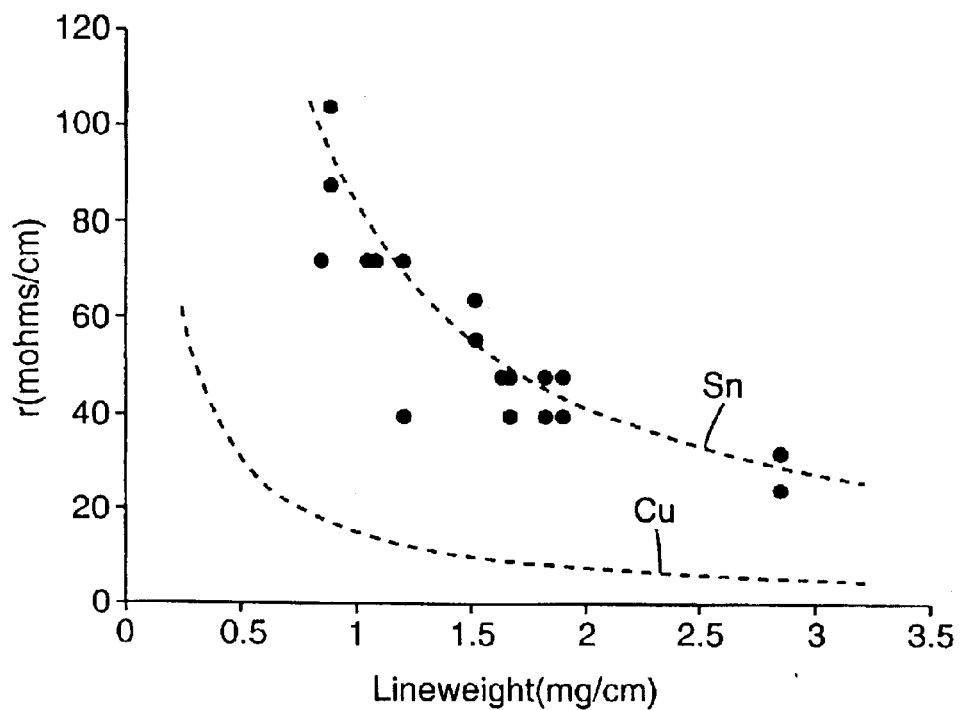
FIG. 6 is a plot of resistance as a function of line weight for paper substrates with copper conductive patterns.

Copper powder as described in Example 2 was sieved onto Whatman 54 filter paper. The patterns were captured as follows: a matching set of steel dies were used, 2" (5 cm) in diameter and 0.75" (1.9 cm) thickness. Each die had a set of two circular ridges 0.4 mm wide, 39 mm and 40 mm in diameter, 0.5 mm high and separated by 0.6 mm. One die had a 0.125" (0.3 cm) diameter guide pin at the center of the die. The other die had a corresponding hole in the center of the die for alignment purposes. The filter paper substrates had previously been punched with a 0.25" (0.6 cm) paper punch to allow the guide pin to pass through the paper. The copper powder coated paper substrate was sandwiched between the dies and pressed in a Carver platen press for 2 seconds at 330 MPa capturing and densifying the powder in a single step. A series of samples were prepared in this manner in which the mass of the copper powder was varied while the line width remained constant. The measured resistance per unit length is shown in FIG. 6. The theoretical resistance corresponding to a perfect copper line and a perfect tin line are also shown as dotted lines.

Example 21

Figure 7:
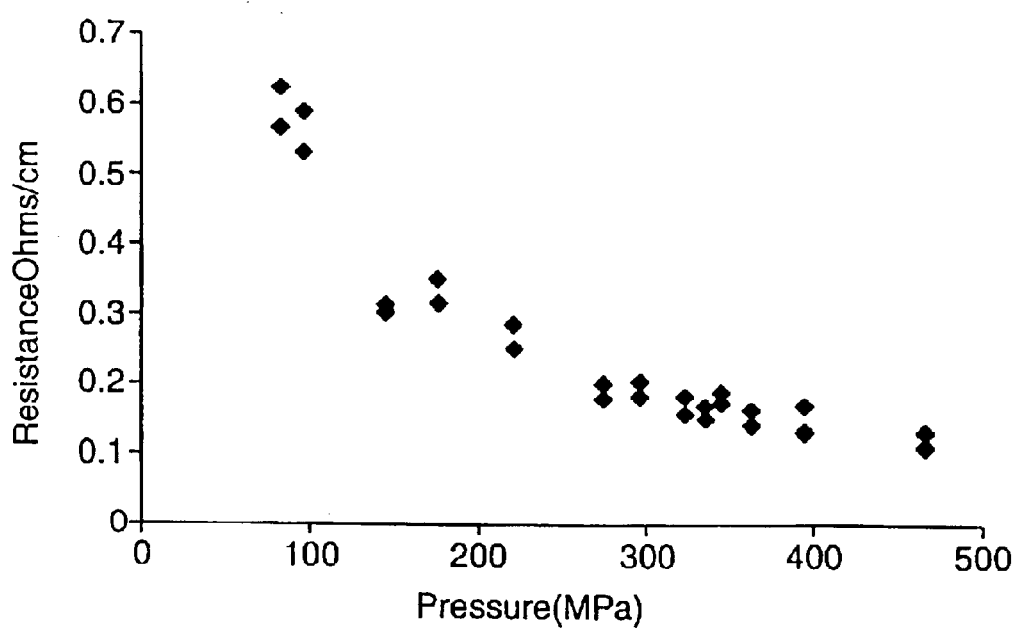
FIG. 7 is a plot of resistance as a function of the applied pressure used for densification.

Samples were prepared in a manner similar to that of Example 20 except that the copper powder had been left open to the air in a tray for 6 days after cleaning and before preparation of the samples. Samples were pressed at pressures ranging from 80 to 420 MPa. The resistance of the samples was measured and (since the amount of copper captured varied from sample to sample) normalized to a capture weight corresponding to a capture thickness of 50 microns. The results are plotted in FIG. 7.

Example 22

The resistance values of the samples for Example 20 were normalized to a line thickness of 50 microns and then averaged. The resistance values for the samples of Example 21 that were prepared at the pressure used for Example 20 (330 MPa) were similarly averaged (they had previously been normalized to a line thickness of 50 microns in Example 21). The samples for Example 20, prepared from freshly cleaned copper powder, gave a normalized average resistance of 0.054 ohms/cm. The samples of Example 15, prepared from the same copper powder after aging in air for 6 days, gave a normalized average resistance of 0.168 ohms/cm. The increase in the resistance of samples in Example 21 is believed to be due to the formation of oxide on the copper powder as it is exposed to air.

Example 23

Four samples were prepared using the one step procedure and materials of Example 20 at a pressure of 250 MPa. The resistance of the circuits was measured as in Example 1. The samples were then set into an aluminum foil tray and placed for 10 minutes in an oven at 200° C. The samples were removed and the resistance was measured again. These data show a reduction in resistance after heat treatment. The before and after resistances of the eight circuits are summarized in Table 3:

TABLE 3

Summary of resistances before and after heat treatment

| sample | a | b | c | d | e | f | g | h |
|---|---|---|---|---|---|---|---|---|
| ohms-before | 3.9 | 3.5 | 3.3 | 3.2 | 4 | 3.7 | 2.2 | 2.2 |
| ohms-after | 2.2 | 2.1 | 1.6 | 1.9 | 2 | 1.9 | 1.2 | 1.2 |

Example 24

A copper powder coated piece of Whatman 54 filter paper was placed between matching dies as described in Example 20. Rather than place the die in a platen press, the die was struck once with a hammer to compress the powder. The resulting copper circuits appeared similar to those prepared by pressing in the platen press. This demonstrates that very short contact times including rapid impact are useful for the practice of this invention.

Example 25

Copy paper (Hammermill CopyPlus 20/50 lb) was cut into 2" by 2" squares. A set of 4 samples were coated with copper powder (3 micron dendritic, as-received from Sigma-Aldrich) at a distribution of roughly 1.2 grams of copper powder covering the 2" by 2" area (6.45 cm$^2$) of each paper substrate. The coating (sieving) method was that of Example 2. A patterned die was used to compress the powder at a pressure of 370 MPa The substrates were weighed before and after the circuit was formed, and the average circuit weight was 0.034 g, or 0.0014 g/cm of circuit line. The average resistance of the circuit lines was 0.19 ohms/cm. A second set of samples was prepared in an identical manner except that an underlayer of tin powder was first sprinkled onto the substrates. The average weight of the circuit lines was 0.0017 g/cm and the average resistance was 0.17 ohm/cm.

The two sets of samples were then subjected to adhesion tests according to the procedure described below. This test also tests the flexibility range of the substrates having metal patterns thereon.

A 1 mm wide slit was cut into each sample to break the circuit lines into two partial circles (358° rather than 360°).

Ohmmeter probes were attached to the circuits on each side of the slits. The samples were then bent around a series of decreasing diameter metal or glass rods (20.1, 12.7, 10.5, 9, 8, 7, 6, 5, 4, and 3 mm diameters), each time straightening the sample before bending it around the next size rod. Resistance measurements were made before, during, and after bending the sample around each rod size. If a circuit pattern cracks or delaminates from the substrate during the bending process, resistance becomes infinite. Samples without a tin underlayer were able to bend around a 20.1 mm diameter rod without delamination of the metal pattern from the substrate, showing useful flexibility. The set of samples with the tin underlayer were also able to bend around 20.1 diameter rods, and around rods as small as 3 mm in diameter without the circuit lines delaminating from the substrates. In one sample, the circuit pattern did not crack when wrapped around the 3 mm rod and its measured resistance, over the 12 cm circumference of the line, increased from 2.3 ohms to 3.6 ohms while bent around the rod and back to 2.4 ohms after bending. This experiment illustrates the improved durability with respect to bending of circuit patterns when an underlayer of tin is used.

Example 26

This example demonstrates a two-step process, where the metal powder composition was captured using a hydraulic press and further densified using ultrasonic energy.

Cu powder (dendritic, Sigma-Aldrich) was pressed as a pattern in one step at 340 MPa on filter paper as in Example 4. A segment of the pattern was further treated with ultrasonic energy. An ultrasonic horn with a 25 mm by 1 mm raised portion on the end of the horn tip, powered by a Branson 900M 2000 watt power supply using a 1:1 booster, at 20 kHz, was pressed onto a portion of the captured pattern at 6.9 MPa. Then 20% ultrasonic power was applied for 200 ms. The pattern before sonicating had a resistance of 0.2 ohms/cm. After sonicating the best result produced a 40% reduction in resistance to 0.12 ohms/cm.

Example 27

Copper powder (dendritic, Sigma-Aldrich) was sprinkled onto filter paper (Whatman 54) using the sieving method of Example 2. The Cu powder layer was pressed using the ultrasonic horn tip described in Example 26, at a pressure of 6.9 MPA for 1 second and then sonicating for 200 ms at 20% power, 20 kHz, 1:1 gain on the Branson 900M power supply. This produced a pattern having a resistance of 0.28 ohms/cm.

Example 28

Two layers of metal, tin and then copper, were sprinkled onto a piece of Teslin™ (0.22 mm thickness) consisting of a 1:3 ratio of tin and copper, respectively. The Cu powder was obtained from Sigma-Aldrich (Cu, dendritic, 3 micron, 99.7%). The Sn powder was obtained from Micron Metals (Sn, tetragonal, 5 micron, 99.9%). The layered powders were set on a stage under the ultrasonic horn. The horn was pressed onto the sample at 6.9 MPa using a 25 mm by 1 mm raised portion of the die before application of ultrasonic energy. The horn operated at 20 kHz, for 1 second, using a 0.6 gain horn adapter on a Branson 900M 2000 watt power supply. Pressing resulted in a metal pattern thickness of approximately 25 microns. This produced a circuit having a resistivity of 0.008 ohm/cm with excellent adhesion. Adhesion resistance was tested using tape and fingernail tests: tape available from 3M Company, St. Paul Minn. under the trade designation Scotch Magic Tape was applied to the metal traces and peeled off, removing none of the metal adhered to the substrate. The metal trace was scraped with a fingernail using moderate force and the trace remained adhered to the substrate.

Samples prepared with shorter sonication times had larger resistances: (200 ms, 0.2 ohm/cm), (375 ms, 0.07 ohms/cm), (500 ms, 0.07 ohms/cm), (750 ms, 0.04 ohms/cm).

Example 29

Via holes of diameter 0.2 mm were punched into a Teslin substrate and a liner was placed under the entire piece. Tin and then copper powder was sprinkled onto the substrate filling the holes and evenly coating the material. The sample was pressed in a two-step process under similar conditions to those described in Example 2. This produced a circuit on one side with metal-containing vias formed through the substrate. The pressed metal powder maintained enough structural integrity to bridge the via hole and partially fill it. The metal-filled via was shown to be conductive from the non-pattern side of the substrate and exhibited a resistance comparable to that of a pressed metal trace, determined by measuring the resistance using voltmeter probes on both sides of the via. Both the metal powder in the via and the substrate compressed.

Example 30

Fifty grams of copper powder (dendritic, Sigma-Aldrich) were placed in 100 ml of formic acid in a stoppered flask. The flask was closed and shaken to completely mix the copper powder with the acid. 400 ml of water was added and the liquid was then removed by using an aspirator and #4 filter paper. An additional 1000 ml of water was filtered through the powder to rinse the formic acid from the powder. While still damp and caked, 20 g of the moist copper powder was mixed with 8 ml of water to make a slurry. The slurry was knife coated onto a 0.18 mm thick Teslin substrate using a notch bar with a 0.25 mm gap above the substrate. The slurry-coated was allowed to absorb the excess water from the slurry for about 1 minute, causing the slurry to solidify into a damp but easy to handle coating. Several 6 cm by 6 cm samples were cut out of the substrate while the coating was still damp. The samples were pressed as described for the first step in Example 2 at a pressure of 36 MPa. The samples were allowed to dry, and the excess copper powder was blown from the substrate using compressed air. At this point, the circuit on the samples had a resistance of typically 65 ohms over the 123 cm long spiral path of the circuit. Two 1 mm diameter holes were punched 12 mm apart into a 0.08 mm thick by 89 mm wide tape available from 3M, St. Paul, Minn. under the trade designation Scotch Hi-Temp Masking Tape. The tape was placed over the circuit of one sample so that the holes coincided with the ends of the circuit. The tape afforded extra strength to the trace and the holes allowed access to the trace for resistance measurements. Excess tape was trimmed from the sample to give a 6 cm by 6 cm area. The sample with the tape applied was placed between two 6 cm by 6 cm by 1.2 cm stainless steel plates and compressed to 113 MPa. The resulting sample had a resistance of 39 ohms measured through the holes in the tape. The sample was folded and sharply creased, Teslin side in. The resistance increased to 46 ohms. No breaks were visible in the circuit.

This example demonstrates the process of coating metal powder as a slurry and it also demonstrates the creation of a rugged circuit using an additional layer of material applied over the circuit.

Example 31

A sample was prepared using according to Example 9, but this sample had several cracks that created infinite resistance across those defects. It was then was treated with microwave energy: The sample was placed in a Canada Technologies Microwave 2100 that operated at 6.3 GHz at 200 watts for 30 seconds. The microwave energy bonded the metal crack and restored the conductivity to the metal pattern.

Example 32

A test was performed to measure the differences in the properties of paper and compressible material and a comparative material (polypropylene film) under compression.

An Instron 4505 Instrument (Instron Corporation, Canton, Mass.) was setup in the compression mode with 100K Newton fixtures. The Instron was programmed to compress at a rate of 0.025 inches/minute (0.64 mm/min). A stack of circular sample coupons, 1.27 cm in diameter, was prepared from pieces punched out from a sheet of each material (each material was supplied as a sheet or film). Each sample stack was then place between the platens of the Instron and compressed to an initial thickness at approximately 10 psi (0.07 MPa) to begin the test run. The thickness of the material is automatically measured by the Instron, the diameter was measured using a pair of calipers and measurements were documented at corresponding pressures and thicknesses. The Instron reports pound-force. The psi values are the pound-force divided by the area calculated from the diameter measurements at each pound-force data point. Therefore if the material expands laterally, the area will increase and the corresponding psi will decrease at the same pound-force value. The volume data is the area multiplied by the thickness at a specific pound-force data point.

Three kinds of paper material, a filled porous polymer and a comparative highly dense polymer were tested. The paper samples were Whatman 54 Filter paper (Whatman Inc, Clifton N.J.), Hammermill copy paper (International Paper, Memphis Tenn.) and tan file folder card stock (Globe-Weis Premium File Folders, ATAPCO, Baltimore, Md.). The filled porous polymer was Teslin (0.18 mm, PPG Industries Pittsburgh Pa.). The comparative highly dense polymer was polypropylene 0.46 mm film, (3M Company St. Paul Minn.).

Table 4 lists the percent change in diameter at pressures applied to the circular coupons, where % change=100×{[(final diameter)−(initial diameter)]/(initial diameter)}. The diameter is the dimension of the sample that is perpendicular to the direction of the applied pressure. The paper samples change very little in the diameter dimension under pressure. Teslin demonstrated a small change in diameter while comparative polypropylene showed a much greater change in diameter in the range of pressures useful in the practice of this invention. That is, the comparative polypropylene showed a large increase in the dimension perpendicular to the direction of the applied pressure, due to lateral flow of the sample.

Figure 8:
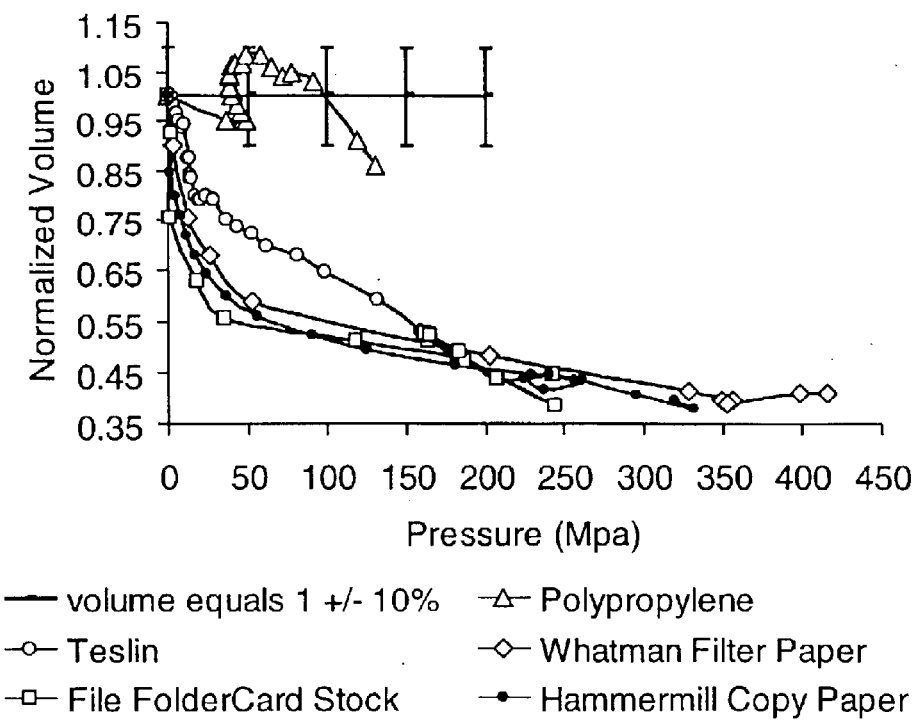
FIG. 8 is a plot of normalized substrate volume as a function of applied pressure.

FIG. 8 shows the data for normalized volume versus pressure at each pressure. The normalized volume at each pressure is shown as a decimal fraction at that of the initial volume for each sample, and is calculated by dividing the volume at each pressure by the volume at 0.07 MPa for that sample. It can readily be seen from FIG. 8 that paper materials and Teslin have a significant change in volume with pressure while the comparative dense polypropylene volume remains nearly constant up to pressures of 17,000 psi (117 MPa). The paper materials and Teslin reduced in volume nearly 40% at pressures of 17,000 psi (117 MPa) and above.

Figure 9:
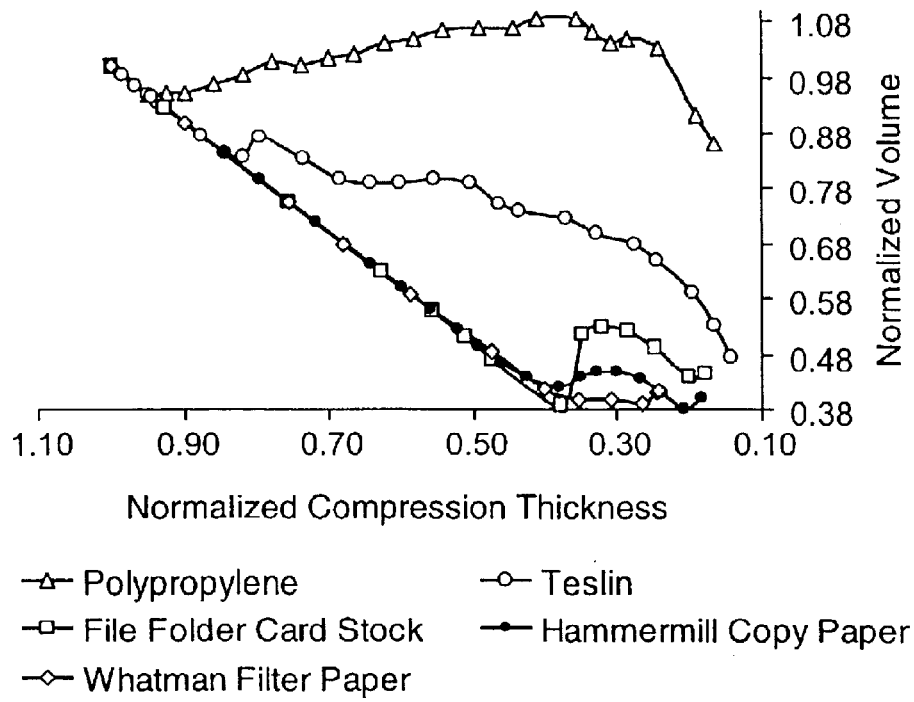
FIG. 9 is a plot of normalized substrate volume versus normalized substrate compression thickness.

FIG. 9 illustrates the relationship between normalized compression thickness (the dimension in the direction parallel to the direction of the applied pressure) and normalized volume. Normalized compression thickness is the thickness at a given pressure, divided by initial compression thickness at 0.07 MPa. The comparative polypropylene volume is substantially constant (± about 10% of the initial volume); although it decreases greatly in thickness it increases in diameter. Materials useful in the practice of this invention show large decreases in compression thickness under applied pressure but little or no increase in diameter, leading to overall decreases in volume. As FIG. 9 illustrates, materials, particularly paper, that change volume primarily due to a change in compression thickness are indicated by a slope of 1.0.

TABLE 4

| Material | Change in Diameter with Applied Pressure | Pressure, psi | Pressure, Mpa |
|---|---|---|---|
| Whatman 54 Filter Paper | <5% | 50,000 | 345 |
| Hammermill Copy Paper | <5% | 37,000 | 255 |
| File Folder Card Stock | <5% | 35,000 | 241 |
| Teslin ™ | ~40% | 7,600 | 52 |
| Teslin ™ | ~73% | 17,000 | 117 |
| Polypropylene | ~72% | 7,600 | 52 |
| Polypropylene | ~119% | 17,000 | 117 |

Example 33

Figure 11:
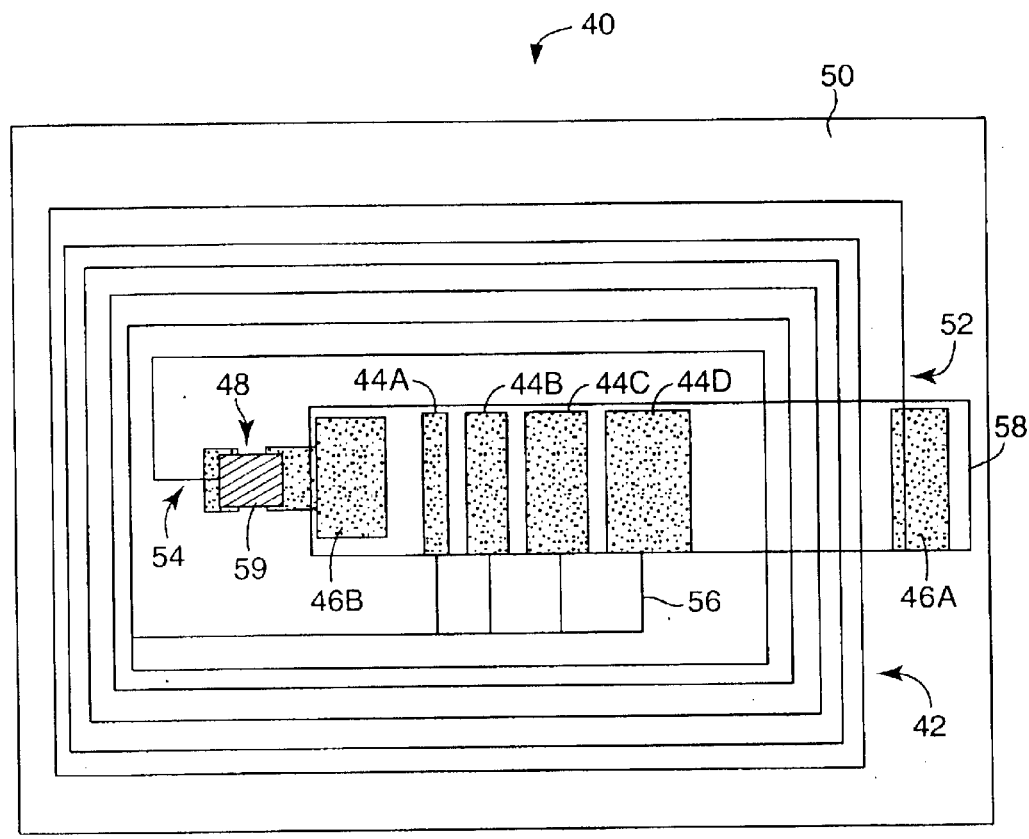
FIGS. 11-12 illustrate an exemplary RFID tag.
Figure 12:
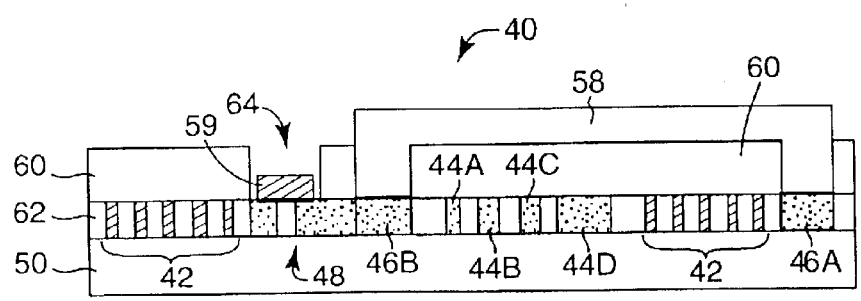

FIG. 11 illustrates an exemplary RFID tag 40 produced in accordance with the manufacturing techniques of the invention. Specifically, FIG. 11 is a plan view of RFID tag 40 and FIG. 12 illustrates a cross-sectional view of RFID tag 40. In the exemplary embodiment, RFID tag 40 includes a number of electrical components, including an antenna formed from a plurality of loops 42. In addition, RFID tag 40 includes capacitor plates 44A–44D ("44"), connection pads 46A, 46B ("46"), and an integrated circuit (IC) connection site 48 formed on a substrate 50.

In this example, one or more of the components in RFID tag 40 are formed by depositing a layer of a metal powder composition onto a selected portion of substrate 50 and applying pressure to the metal powder composition in order to capture a pattern on substrate 50. A hydraulic press that has one or more projections, such as hydraulic press 1 illustrated in FIG. 1, is used to apply pressure to the metal powder composition. The metal powder composition that was compressed by the projections of the hydraulic press adheres to the portions of substrate 50 to capture the conductive pattern. The metal powder composition that was not compressed by the projections of hydraulic press does not adhere to substrate 50 and is removed. The resulting conductive pattern forms one or more electrical components.

As illustrated in the example of FIG. 11, loops 42 form a spiral made from a continuous trace. Loops 42 that form the antenna portion of RFID tag 40 terminate at a first end 52 and a second end 54. First end 52 of the antenna portion of the captured pattern is located outside of loops 42 and the second end 54 of the antenna portion is located within an inner space defined by the loops 42.

Connection pads 46A and 46B are electrically connected to the respective ends of the antenna. More particularly, connection pad 46A is electrically connected to first end 52 and connection pad 46B is electrically connected to second end 54. Connection pad 46B is further electrically connected to integrated circuit (IC) connection site 48. Capacitor plates 44 are electrically connected to the antenna via a capacitor plate connection 56.

A bridge 58 is electrically connected to connector pads 46 to form a closed circuit between the first and second ends 52, 54 (except for the open or space between IC connection sites 48) and also form capacitors.

FIG. 12 illustrates a cross-sectional view of RFID tag 40. As illustrated in FIG. 12, RFID tag 40 includes a bridge 58, a capacitor dielectric layer 60, an antenna layer 62, and a substrate layer 50. Antenna layer 62 is formed using the techniques described above. As described, antenna layer 62 includes a plurality of loops 42 formed from one continuous trace, capacitor plates 44, conductive pads 46, and IC connection pads 48. As illustrated, bridge 58 is electrically connected to connection pads 46, closing the circuit and forming capacitors. RFID tag 40 further includes an access hole 64 to IC connection pads 48 to allow an integrated circuit 59 to be included in RFID tag 40.

The antenna structure is described in detail in a patent application entitled "RFID Tag with Bridge Circuit Assembly and Methods of Use," and having Ser. No. 09/909154, the entire content of which is incorporated herein by reference.

Three samples were prepared using paper as substrate 50.

In one sample, a bare Atmel AT88RF236-13 RFID IC (Atmel Corporation, San Jose, Calif.) was electrically attached to the IC connection pads 48 using an anisotropic conductive adhesive film.

In another sample a packaged Atmel DVS29622-2 RFID IC, resonant at 13.56 MHz, was attached to the IC connection pads using solder to make a conductive bond. The capacitance was trimmed by decreasing the area at bridge 58, resulting in a resonant tag at 13.56 MHz. This sample was read by an RFID reader at a distance of 10 cm (between the reader antenna and the sample) and written to by the reader at a distance of 5 cm.

A third sample was prepared with a different antenna design to create a dipole antenna for an RFID tag operable at 915 MHz. This tag had a packaged 915 MHz RFID IC Intellitag 500 Chip (Intermec Technologies Incorporated, of Intermec Everett, Wash.) and was connected by solder to the metal powder pressed antenna. The tag was read with a Multi-Protocol UHF reader available from AWID Applied Wireless of Monsey, N.Y., at a distance of 91 cm.

Example 34

A first sample 1 was made as follows. A pressed powdered metal antenna, referred to as "antenna 34.1," was made on a paper substrate as in Example 33; however, the final press with a smooth platen was delayed a step. A second piece of paper, referred to as "substrate 34.2," was sprayed with adhesive, and was punched to create holes 34.3 in positions which would align with the connection pads 46 on antenna 34.1. An additional access hole 34.4 was made in a position to align with IC connection pads 48. These holes were aligned as indicated with antenna 34.1(34.3 to 46, and 34.4 to 48). Substrate 34.2 was then laminated to antenna 43.1 in registration. Portions of substrate 34.2 were covered with a mask, which covered (prevented deposition of metal powder on) access hole 34.4, but allowed deposition of metal powder in 34.3 and in a pattern approximately the size and shape of bridge 58, FIG. 11. Tin and copper were coated on substrate 34.2 through the mask. The mask was lifted and the shape of the bridge in metal powder remained. The punched holes 34.3 had been filled with metal powder in this process.

Antenna 34.1, substrate 34.22 and the metal powder bridge were then compressed to densification under smooth platens at a pressure of 345 MPa. The bridge and vias so formed created a continuous conductive layer and created an electrical connection between the ends of the loop antenna 46. The resistance for the vias was measured at 0.3 ohms. The circuit had a resonance of 18.5 MHz, as measured on a Hewlett-Packard (4194 Impedance/Gain Analyzer with a 41941-61001 Impedance probe.

Another sample 2 was prepared with a metal powder-based antenna, a metal foil bridge 58 and a polymer dielectric (3M Conservation and Restoration Tape 888 and 3M 9502 Transfer Adhesive, 3M Company, St. Paul Minn.). Comparative sample 3 was prepared using a plated metal antenna, a metal foil bridge 58 and a polymer dielectric as in sample 2. All three resonant circuits had a segmented capacitive bridge, which allowed trimming the capacitance in order to shift the resonant frequency.

Table 5 shows the data from trimming similar amounts of capacitance sequentially resulting in a shift of resonant frequency. "Cap" refers to the number of capacitors trimmed from the circuit. The resonant frequency is reported in MHz at each level of capacitance. "Delta f" refers to the shift in frequency between each capacitive adjustment. The data in Table 5 illustrate that RFID tags of the invention are tunable.

TABLE 5

Change in Resonant Frequency with change in capacitance

| Cap | Sample 1 f | Delta f | Sample 2 f | Delta f | Comparative Sample 3 f Delta f |
|---|---|---|---|---|---|
| 0 | 18.5 MHz | | 16.4 MHz | | 13.4 MHz |
| 1 | 21.5 | 3.0 | 18.7 | 2.3 | 66.4 3.0 |
| 2 | 23.9 | 2.4 | 21.0 | 2.3 | 18.7 2.3 |
| 3 | 25.9 | 2.0 | 22.6 | 1.6 | 20.0 1.3 |

Example 35

A metal powder pattern was produced as in Example 2. This pattern contained lines of varying line width and spacing. Table 6 shows resistance data and specifications of this pattern.

TABLE 6

Change in Resistance with Different Line Width and Spacing

| Powdered metal Lines | copper 1 | copper 2 | copper 3 | copper 4 |
|---|---|---|---|---|
| Line width | 1.0 mm | 0.8 mm | 0.6 mm | 0.4 mm |
| Line spacing | 0.8 | 0.4 | 0.3 | 0.4 |
| Resistance Ohm/cm | 0.10 | 0.14 | 0.20 | 0.29 |

A number of embodiments of the invention have been described. Nevertheless, it will be understood that various modifications may be made without departing from the spirit and scope of the invention. Accordingly, other embodiments are within the scope of the following claims.

What is claimed is:

1. An article comprising a conductive pattern on a substrate that forms an electrical component of an electromagnetic communication circuit, wherein the conductive pattern comprises a densified metal powder composition compressed into at least a portion of the substrate, and wherein the substrate is selected from a group consisting of paper and materials that are at least about 10% compressible.

2. The article of claim 1, wherein the article comprises a resonant label.

3. The article of claim 1, wherein the article comprises a radio frequency identification tag.

4. The article of claim 1, wherein the article comprises a radio frequency identification reader.

5. The article of claim 1, wherein the electrical component includes at least one of a capacitor, a resistor, an inductive coil, a loop antenna, a dipole antenna, a connector, a connector pad, a capacitor pad, a via, and a fuse.

6. The article of claim 1, wherein the electrical component is all or part of an antenna.

7. The article of claim 6, wherein the conductive pattern forms the antenna to include a plurality of loops.

8. The article of claim 7, wherein the conductive pattern forms the plurality of loops of the antenna as a continuous trace.

9. The article of claim 7, wherein the conductive pattern forms at least one conduction pad electrically coupled to at least one loop of the antenna.

10. The article of claim 7, wherein the conductive pattern forms a bridge that electrically couples ends of the antenna loops to close a circuit.

11. The article of claim 7, wherein the conductive pattern forms a capacitor plate coupled to at least one of the loops of the antenna.

12. The article of claim 1, wherein the conductive pattern forms an integrated circuit connection site.

13. The article of claim 1, wherein the densified metal powder composition is formed by depositing the metal powder composition on the substrate and densifying the metal powder composition to obtain the conductive pattern.

14. The article of claim 1, wherein the metal powder composition includes at least one of copper, tin, lead, silver, gold, platinum, graphite, aluminum, nickel, iron, and zinc.

15. The article of claim 1, wherein the substrate comprises paper.

16. The article of claim 1, wherein the conductive pattern comprises one of a plurality of conductive patterns formed on more than one plane of the article.

17. The article of claim 1, wherein the conductive pattern consists essentially of the densified metal powder composition.

18. The article of claim 1, wherein the article comprises one of a radio frequency identification label, a ticket containing an integrated circuit, and a card containing an integrated circuit.

19. The article of claim 1, further comprising at least one of integrated circuits, metal foils, conductive inks, conductive adhesives, magnetic storage media, magnetic security media, solder, wire, saturants, films, laminating adhesives, mechanical fasteners, and discrete electrical components.

20. The article of claim 1, wherein at least a portion of the conductive pattern is compressed into the substrate.

21. The article of claim 1, wherein the conductive pattern contains agents that comprise no more than 5% of the conductive pattern by weight.

22. The article of claim 1, wherein the conductive pattern contains agents that comprise no more than 3% of the conductive pattern by weight.

23. The article of claim 1, wherein the conductive pattern contains agents that comprise no more than 1% of the conductive pattern by weight.

24. An article comprising:
at least one loop that forms an antenna; and
at least one capacitor plate electrically coupled to the loop of the antenna,
wherein at least one of the antenna or the capacitor plate is defined by a conductive pattern of densified metal powder composition on a substrate, and at least a portion of the conductive pattern is compressed into the substrate, and wherein the substrate is selected from a group consisting of paper and materials that are at least about 10% compressible.

25. The article of claim 24, further comprising connection pads that are in electrical communication with opposite ends of the loop, wherein at least one of the connect pads is defined by the conductive pattern.

26. The article of claim 24, further comprising a bridge that conductively bonds to the connection pads to close the circuit between the ends of the loop.

27. The article of claim 24, wherein the metal powder composition includes at least one of copper, tin, lead, silver, gold, platinum, graphite, aluminum, nickel, iron, and zinc.

28. An article comprising a conductive pattern on a substrate, wherein the conductive pattern forms all or part of one or more electrical components, wherein the conductive pattern consists essentially of a densified metal powder composition, and wherein the substrate is selected from the group consisting of paper and materials that are at least about 10% compressible.

29. The article of claim 28, wherein the article is one of an antenna, a resonant coil, a resonant label, a ticket, a card, a fuse and a resistor.

30. The article of claim 28, wherein the article comprises at least one of a loop antenna, a dipole antenna, a connector pad, a bridge, a fuse and a resistor.

31. The article of claim 30, wherein the loop antenna includes a plurality of loops.

32. The article of claim 30, where the conductive pattern forms a bridge that electrically connects to each end of the antenna loop.

33. The article of claim 30, further comprising at least one capacitor plate electrically connected to the loop antenna.

34. The article of claim 28 wherein more than one plane of the article comprises a conductive pattern.

35. The article of claim 28 further comprising at least one of a metal foil, a conductive ink, a conductive adhesive, magnetic storage media, magnetic security media, solder, wire, saturants, films, laminating adhesives, and mechanical fasteners.

36. An article comprising a conductive pattern on a substrate, wherein the conductive pattern forms all or part of one or more electrical components, wherein the conductive pattern consists essentially of a densified metal powder composition, wherein the substrate is selected from the group consisting of paper and materials that are at least about 10% compressible, and wherein the article further comprises at least one component that is not formed by a conductive pattern consisting essentially of a densified metal powder.

37. The article according to claim 36 which is a label providing direct-contact connection to at least one of an integrated circuit, a battery, a display and a sensor.

38. The article of claim 36 which comprises at least one of a connector pad, a resistor and a fuse.

39. The article of claim 36 wherein more than one plane of the article comprises a conductive pattern.

40. The article of claim 36 further comprising at least one of an integrated circuit, a metal foil, a conductive ink, a conductive adhesive, magnetic storage media, magnetic security media, solder, wire, saturants, films, laminating adhesives, mechanical fasteners and discrete electrical components.

* * * * *

UNITED STATES PATENT AND TRADEMARK OFFICE
CERTIFICATE OF CORRECTION

PATENT NO. : 6,816,125 B2
DATED : November 9, 2004
INVENTOR(S) : Kuhns, David W.

It is certified that error appears in the above-identified patent and that said Letters Patent is hereby corrected as shown below:

Column 1,
Line 30, delete "patter" and insert -- pattern --.

Column 8,
Line 2, delete "arc" and insert -- are --.

Column 9,
Line 10, delete "arc" and insert -- are --.

Column 10,
Line 4, delete "arc" and insert -- are --.
Line 5, after "mm)" insert -- . --.

Column 16,
Line 53, after "MPa" insert -- . --.

Column 23,
Line 12, after "connector pad," insert -- a resistor, --.
Line 12, after "a via," insert -- a resistor --.

Signed and Sealed this

First Day of March, 2005

JON W. DUDAS
*Director of the United States Patent and Trademark Office*